US009261570B2

(12) United States Patent
Obana et al.

(10) Patent No.: US 9,261,570 B2
(45) Date of Patent: Feb. 16, 2016

(54) MAGNETIC SENSOR FOR IMPROVING HYSTERESIS AND LINEARITY

(71) Applicant: ALPS ELECTRIC CO., LTD., Ota-ku, Tokyo (JP)

(72) Inventors: Masayuki Obana, Tokyo (JP); Hideto Ando, Tokyo (JP); Shinji Sugihara, Tokyo (JP)

(73) Assignee: ALPS ELECTRIC CO., LTD., Tokyo (JP)

( * ) Notice: Subject to any disclaimer, the term of this patent is extended or adjusted under 35 U.S.C. 154(b) by 679 days.

(21) Appl. No.: 13/708,205

(22) Filed: Dec. 7, 2012

(65) Prior Publication Data

US 2013/0181704 A1 Jul. 18, 2013

(30) Foreign Application Priority Data

Jan. 18, 2012 (JP) ................................. 2012-007663

(51) Int. Cl.
*G01R 33/02* (2006.01)
*G01R 33/09* (2006.01)
*H01L 43/08* (2006.01)
*G01R 33/00* (2006.01)

(52) U.S. Cl.
CPC ............ *G01R 33/02* (2013.01); *G01R 33/0017* (2013.01); *G01R 33/093* (2013.01); *G01R 33/096* (2013.01); *H01L 43/08* (2013.01)

(58) Field of Classification Search
CPC .......... G01R 33/0005; G01R 33/0052; G01R 33/0094; G01R 33/02; G01R 33/0017; H01L 43/08

USPC .......................................................... 324/252
See application file for complete search history.

(56) References Cited

U.S. PATENT DOCUMENTS

| 7,855,556 B2 | 12/2010 | Sasaki et al. | |
| 8,054,067 B2 * | 11/2011 | Okada | B82Y 25/00 324/207.21 |
| 2008/0054888 A1 * | 3/2008 | Ando | G01D 5/142 324/207.21 |
| 2010/0253330 A1 * | 10/2010 | Sasaki | B82Y 25/00 324/252 |

FOREIGN PATENT DOCUMENTS

| JP | PCT/JP2011/050529 | * 7/2011 | ............ G01R 33/09 |
| WO | WO 2009-084433 | 7/2009 | |
| WO | WO 2011-089978 | 7/2011 | |

* cited by examiner

*Primary Examiner* — Jay Patidar
*Assistant Examiner* — Dustin Dickinson
(74) *Attorney, Agent, or Firm* — Hunton & Williams LLP (57) ABSTRACT

A magnetic sensor includes a non-bias structure element section that has a laminated structure in which a fixed magnetic layer, a non-magnetic material layer, a free magnetic layer, and a protection layer are laminated, and that is extended in an X1-X2 direction; and soft magnetic bodies that are arranged on the element section in a contactless manner. The soft magnetic bodies include a first section, a second section, and a third section. The second section is located on a Y2 side of the element section and the third section is located on a Y1 side thereof. The second section of one of soft magnetic bodies faces the third section of the other soft magnetic body in a Y1-Y2 direction through the element section. An electrode layer is provided on the element section which faces the joint sections of the second section and the third section in the Y1-Y2 direction.

5 Claims, 8 Drawing Sheets

MAGNETIC SENSOR FOR IMPROVING HYSTERESIS AND LINEARITY

CLAIM OF PRIORITY

This application contains subject matter related to and claims the benefit of Japanese Patent Application No. 2012-007663 filed on Jan. 18, 2012, the entire contents of which is incorporated herein by reference.

BACKGROUND OF THE DISCLOSURE

1. Field of the Disclosure

The present disclosure relates to a magnetic sensor in which hysteresis and linearity are improved.

2. Description of the Related Art

A magnetic sensor using magneto-resistive sensors can be used as, for example, a terrestrial magnetic sensor which detects terrestrial magnetism incorporated into a portable apparatus such as a mobile phone.

WO2009/084433 and WO2011/089978 are examples of the related art. In the related art, when an exceptionally strong magnetic field acts in a magnetic sensor which is provided with a bias layer used to supply a bias magnetic field to element sections from the outside, problems occur in that outputs (middle point potential differences) are changed after the applied magnetic field is removed and in that hysteresis and linearity deteriorate because the magnetization of the bias layer is destroyed or easily fluctuated due to the action of the strong magnetic field. These and other drawbacks exist.

SUMMARY OF THE DISCLOSURE

Embodiments of the present disclosure provide a magnetic sensor in which hysteresis and linearity are improved.

The various embodiments of the present disclosure provide a magnetic sensor including: a non-bias structured element section that has a laminated structure in which, from a bottom, a fixed magnetic layer, a non-magnetic material layer, a free magnetic layer, and a protection layer are laminated in order or in which, from the bottom, the free magnetic layer, the non-magnetic material layer, the fixed magnetic layer, and the protection layer are laminated in order, and that is formed in such a way as to be extended in an X1-X2 direction; and a plurality of soft magnetic bodies that are arranged on the element section in a contactless manner. A sensitivity axis direction of the element section may be a Y1-Y2 direction which is perpendicular to the X1-X2 direction. Each of the soft magnetic bodies may be extended in the Y1-Y2 direction, and may include a first section which faces the element section in a thickness direction in a contactless manner, a second section which is extended from a Y2 side end portion of the first section to the X1 direction and is arranged on the Y2 side of the element section in a plan view, and a third section which is extended from a Y1 side end portion of the first section to the X2 direction and is arranged on the Y1 side of the element section in a plan view. In two soft magnetic bodies which are adjacent in the X1-X2 direction, a part of the third section of a first soft magnetic body which is arranged on the X1 side may face a part of the second section of a second soft magnetic body which is arranged on the X2 side via a gap in the Y1-Y2 direction. A joint section of the third section of the first soft magnetic body, which does not face the second section of the second soft magnetic body, and a joint section of the second section of the second soft magnetic body, which does not face the third section of the first soft magnetic body, may respectively face the element section in the Y1-Y2 direction in a plan view. On the element section which faces the joint sections, an electrode layer which biases current may be arranged.

According to the various embodiments, when the electrode layer is arranged on the upper surface of the element section which faces the joint section and from which the protection layer is removed, it is possible to cause the corresponding section to not have sensitivity as the element section. Further, in an exemplary embodiment, the element section is formed in a long shape in the X1-X2 direction without using a bias layer, thus the element section can be arranged other than magnetic field detection, and it is possible to appropriately obtain the shape anisotropy effect. As described above, compared to the related art, the tolerance of the strong magnetic field is excellent and it is possible to improve hysteresis and linearity.

According to the disclosure, the electrode layer may be arranged in a state in which a part of the protection layer remains. In the configuration, in which, from the bottom, the fixed magnetic layer, the non-magnetic material layer, the free magnetic layer, and the protection layer are laminated in order, the free magnetic layer is not planed, the shape anisotropy effect is effectively exhibited, thus the magnetization direction of the free magnetic layer in the non-magnetic field state is stabilized in a state in which the magnetization direction appropriately faces the X1-X2 direction, and it is possible to appropriately improve hysteresis and linearity properties.

Further, the electrode layer may be arranged on an upper surface of the element section in the X1-X2 direction at an interval, and the interval may be the section where the third section of the first soft magnetic body faces the second section of the second soft magnetic body via the gap, and the first section of each of the soft magnetic bodies may face the electrode layer in the thickness direction in a contactless state. The electrode layer may be simply arranged. In addition, a section which causes current to flow into the element section corresponds to only the section which faces each of the soft magnetic bodies through the gap. Thus it is possible to appropriately improve hysteresis and linearity.

Still further, a plurality of element sections that are formed to be extended in the X1-X2 direction may be provided in the Y1-Y2 direction at intervals, and end portions of the respective element sections in the X1-X2 direction may be connected through a conductive layer.

In various embodiments, the magnetic sensor may further include: a first magneto-resistive sensor, a second magneto-resistive sensor, a third magneto-resistive sensor, a fourth magneto-resistive sensor, each having a non-bias structured element section which has the same laminated structure and sensitivity axis direction. Each of the soft magnetic bodies, arranged in the first magneto-resistive sensor and the fourth magneto-resistive sensor, may include the first soft magnetic body and the second soft magnetic body. Each of the soft magnetic bodies, arranged in the second magneto-resistive sensor and the third magneto-resistive sensor, may include a first section which is extended in the Y1-Y2 direction and faces the element section in the thickness direction in a contactless manner, a fourth section which is extended from the Y2 side portion of the first section to the X2 direction and arranged on the Y2 side of the element section in a plan view, and a fifth section which is extended from the Y1 side end portion of the first section to the X1 direction and arranged on the Y1 side of the element section in a plan view. In two soft magnetic bodies which are adjacent in the X1-X2 direction, a part of the fourth section of a third soft magnetic body arranged on an X1 side may face a part of the fifth section of a fourth soft magnetic body arranged on the X2 side in the Y1-Y2 direction via the gap. A bridge circuit may be configured in such a way that the first magneto-resistive sensor is connected to the second magneto-resistive sensor in series through a first output unit, the third magneto-resistive sensor is connected to the fourth magneto-resistive sensor in series through a second output unit, the first magneto-resistive sensor is connected to the third magneto-resistive sensor through an input unit, and the second magneto-resistive sensor is connected to the fourth magneto-resistive sensor through a ground.

DETAILED DESCRIPTION OF THE DISCLOSURE

The following description is intended to convey a thorough understanding of the embodiments described by providing a number of specific embodiments and details involving a magnetic sensor. It should be appreciated, however, that the present invention is not limited to these specific embodiments and details, which are exemplary only. It is further understood that one possessing ordinary skill in the art, in light of known systems and methods, would appreciate the use of the invention for its intended purposes and benefits in any number of alternative embodiments, depending on specific design and other needs.

Figure 1:
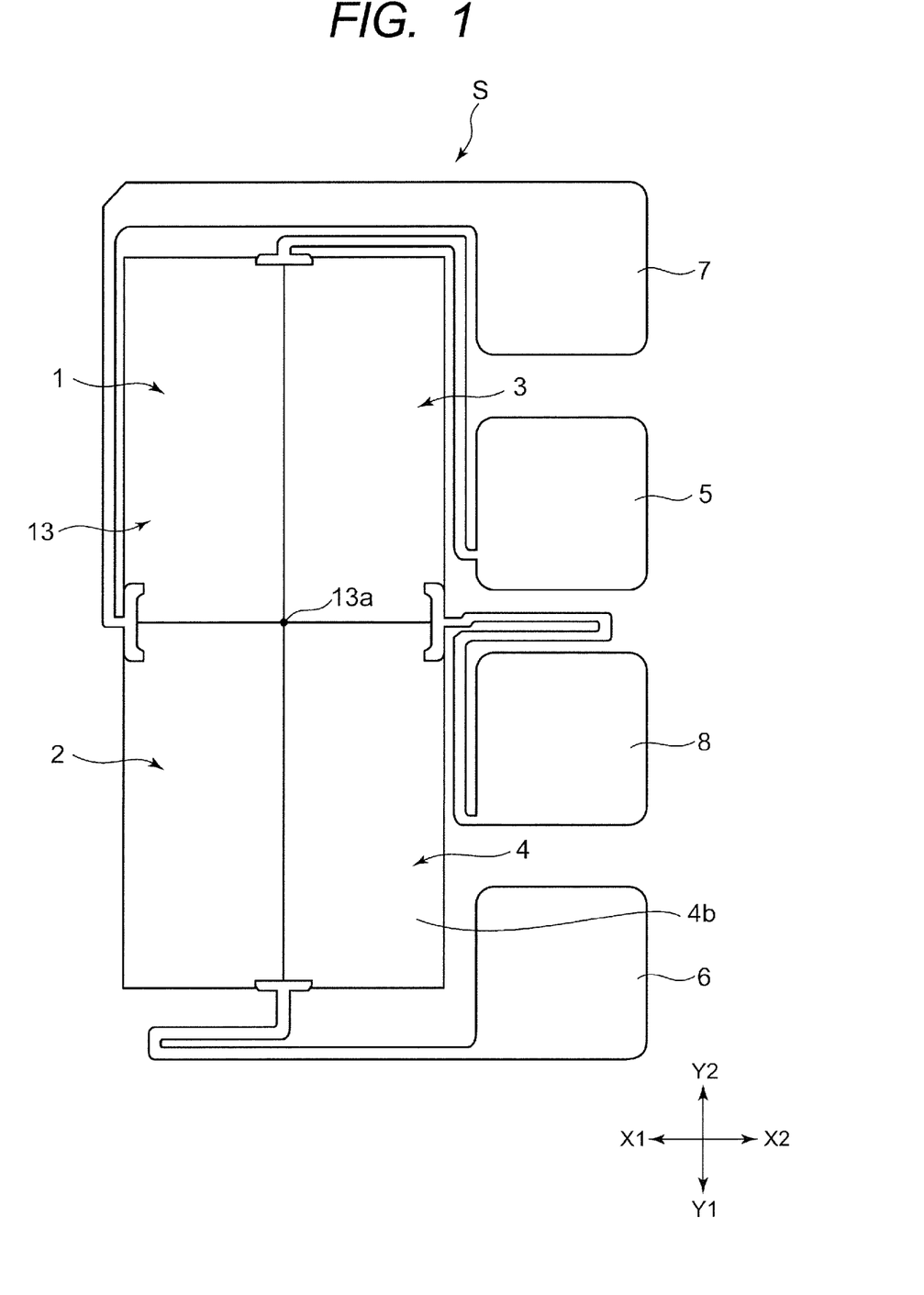
FIG. 1 is a schematic diagram (plan view) illustrating a magnetic sensor according to an embodiment of the disclosure.
Figure 2:
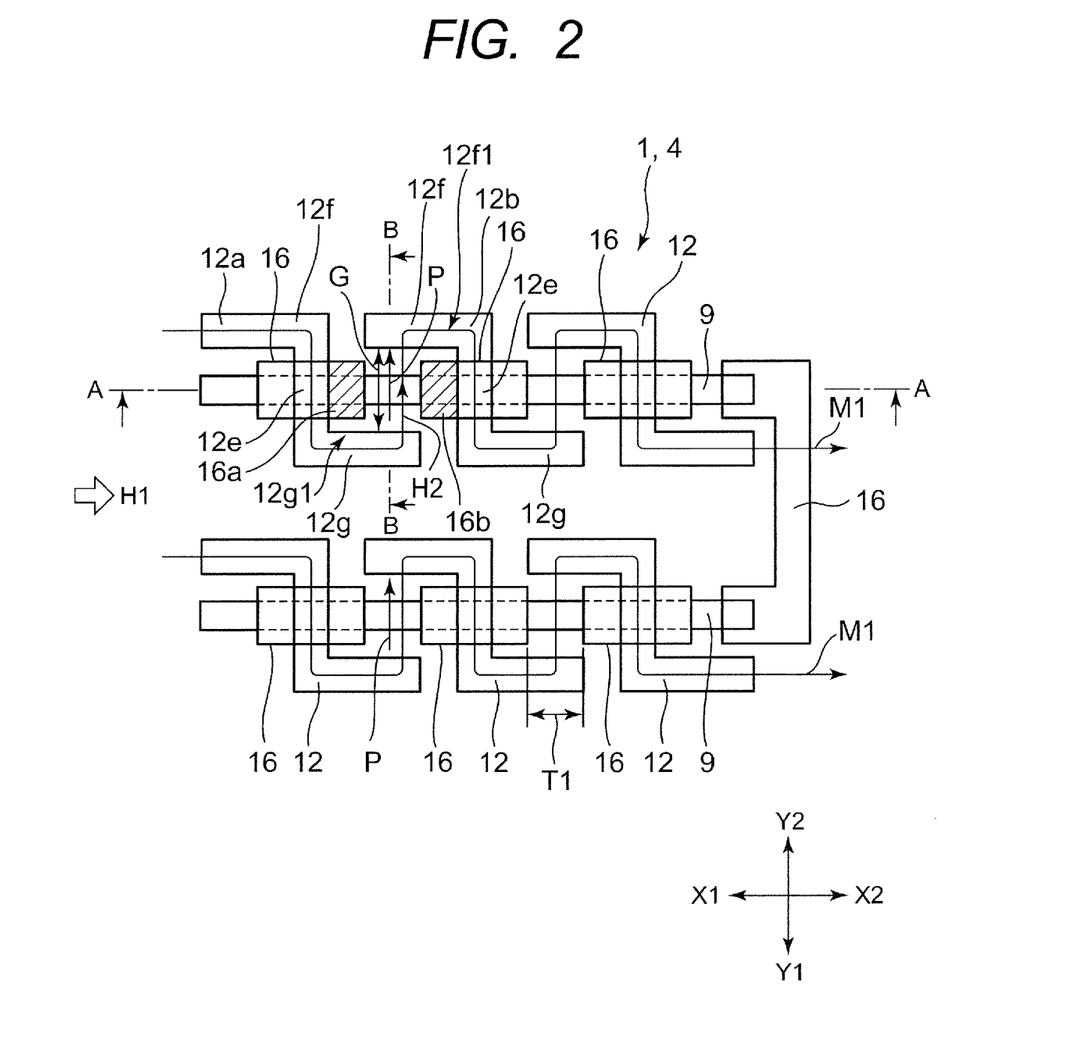
FIG. 2 is a partially enlarged plan view illustrating the magnetic sensor in which a part of a first magneto-resistive sensor and a fourth magneto-resistive sensor is enlarged.
Figure 3:
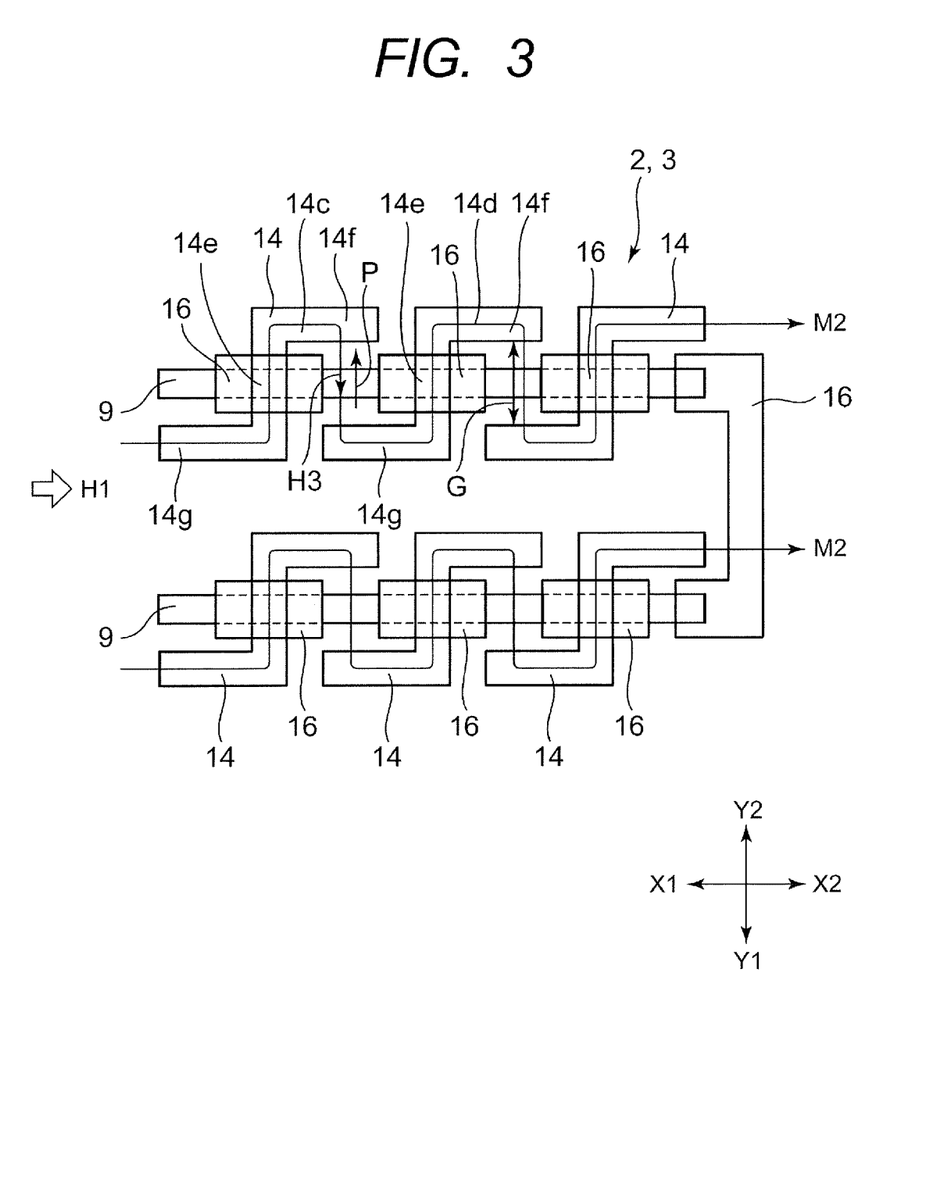
FIG. 3 is a partially enlarged plan view illustrating the magnetic sensor in which a part of a second magneto-resistive sensor and a third magneto-resistive sensor is enlarged.
Figure 4:
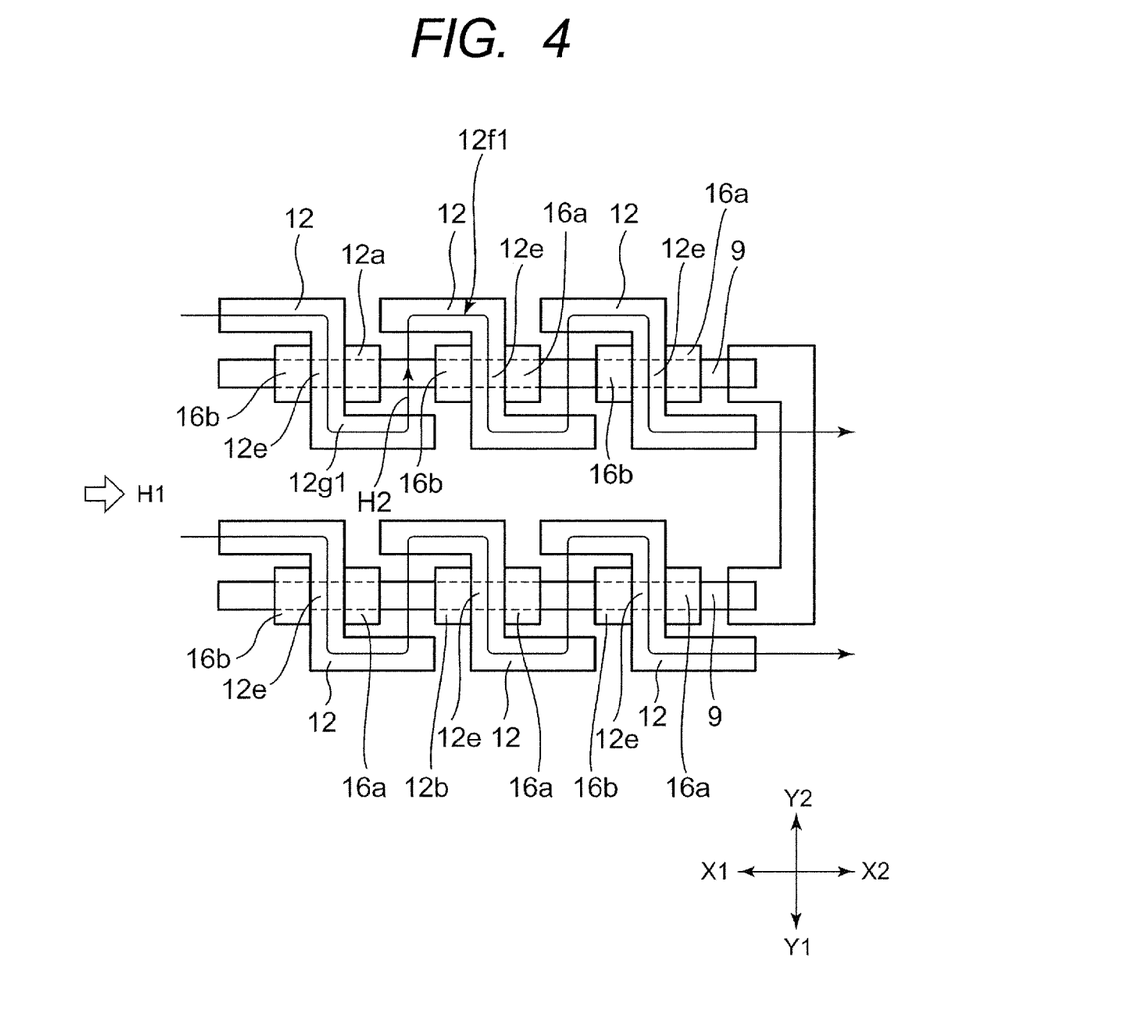
FIG. 4 is a partially enlarged plan view illustrating a magnetic sensor, in which a part of the first magneto-resistive sensor and the fourth magneto-resistive sensor is enlarged, according to an embodiment of the disclosure.
Figure 5:
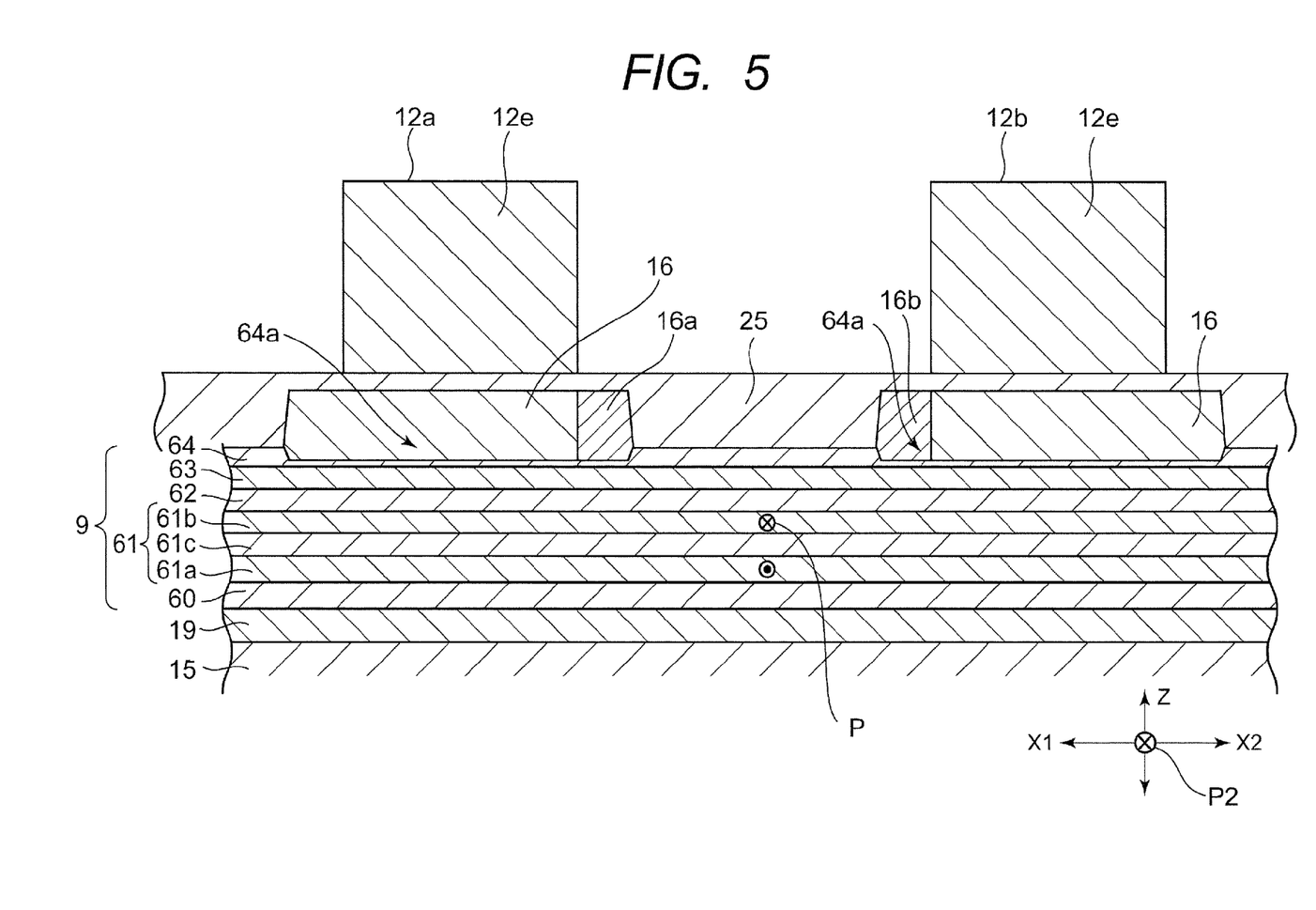
FIG. 5 is a partially enlarged longitudinal section view illustrating the magneto-resistive sensor taken along the A-A line of FIG. 2 and viewed from the arrow direction.
Figure 6:
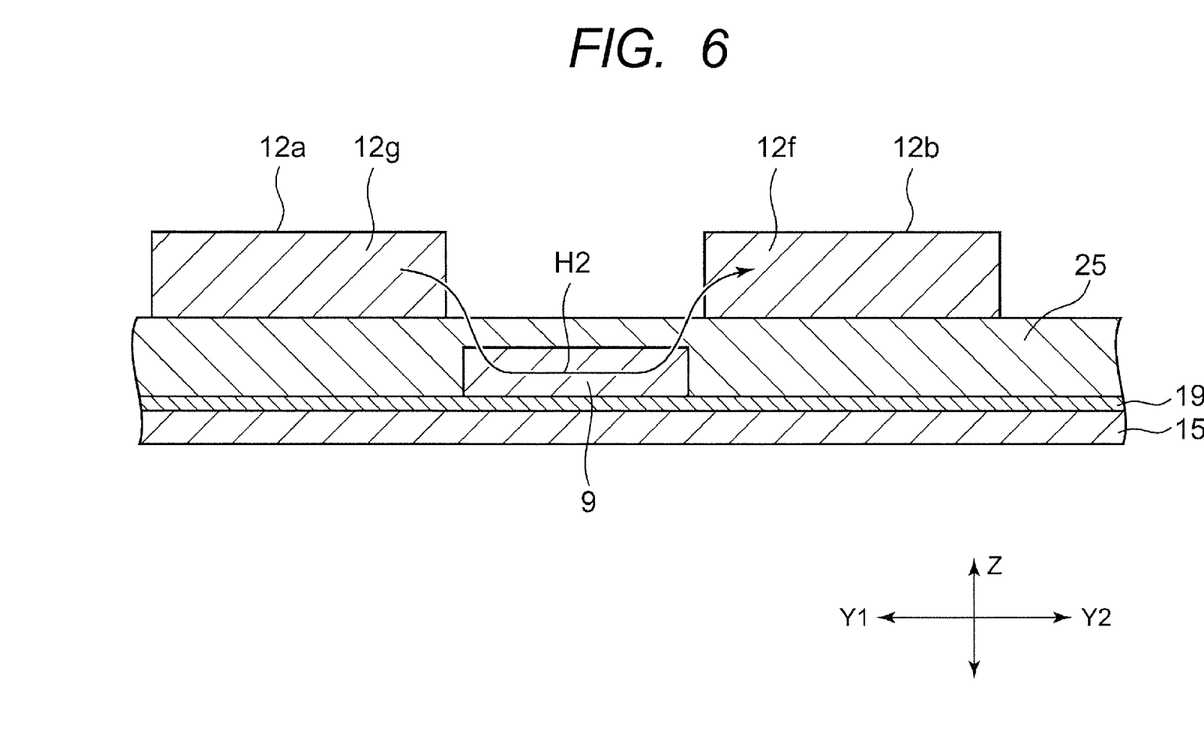
FIG. 6 is a partially enlarged longitudinal section view illustrating the magnetic sensor taken along B-B line of FIG. 2 and viewed from the arrow direction.

FIG. 1 is a schematic diagram (plan view) illustrating a magnetic sensor according to an embodiment. FIG. 2 is a partially enlarged plan view illustrating the magnetic sensor in which a part of a first magneto-resistive sensor and a fourth magneto-resistive sensor is enlarged. FIG. 3 is a partially enlarged plan view illustrating the magnetic sensor in which a part of a second magneto-resistive sensor and a third magneto-resistive sensor is enlarged. FIG. 4 is a partially enlarged plan view illustrating a magnetic sensor, in which a part of a first magneto-resistive sensor and a fourth magneto-resistive sensor is enlarged according to an embodiment which is different from FIG. 2. FIG. 5 is a partially enlarged longitudinal section view illustrating the magneto-resistive sensor taken along the A-A line of FIG. 2 and viewed from the arrow direction. FIG. 6 is a partially enlarged longitudinal section view illustrating the magnetic sensor taken along the B-B line of FIG. 2 and viewed from the arrow direction.

A magnetic sensor S which may include magneto-resistive sensors according to an embodiment is provided as a terrestrial magnetic sensor which is mounted on a portable apparatus, for example, a mobile phone.

An X1-X2 direction and a Y1-Y2 direction shown in each drawing indicate two directions which are substantially perpendicular to each other in a horizontal plane, and a Z direction indicates a direction which is perpendicular to the horizontal plane.

As shown in FIG. 1, in the magnetic sensor S, a magneto-resistive sensor forming region 13 may be divided into four regions by the X1-X2 direction and the Y1-Y2 direction based on the center 13a, and a first magneto-resistive sensor 1, a second magneto-resistive sensor 2, a third magneto-resistive sensor 3, and a fourth magneto-resistive sensor 4 may be formed in the respective regions. Meanwhile, as described later, each of the magneto-resistive sensors 1 to 4 may be formed in a meander shape in such a way that element sections and electrode layers in a row. However, in FIG. 1, the shape within each of the magneto-resistive sensors 1 to 4 is abbreviated and shown.

As shown in FIG. 1, the first magneto-resistive sensor 1 and the third magneto-resistive sensor 3 may be connected to an input terminal (Vdd) 5. In addition, the second magneto-resistive sensor 2 and the fourth magneto-resistive sensor 4 may be connected to a ground terminal (GND) 6. In addition, a first output terminal (V1) 7 may be connected between the first magneto-resistive sensor 1 and the second magneto-resistive sensor 2. In addition, a second output terminal (V2) 8 may be connected between the third magneto-resistive sensor 3 and the fourth magneto-resistive sensor 4. As described above, a bridge circuit may be configured with the first magneto-resistive sensor 1, the second magneto-resistive sensor 2, the third magneto-resistive sensor 3, and the fourth magneto-resistive sensor 4.

Each of the magneto-resistive sensors 1 to 4 may include a plurality of element sections, a plurality of electrode layers, and a plurality of soft magnetic bodies which do not come in contact with the respective element sections and the respective electrode layers.

FIG. 2 shows the first magneto-resistive sensor 1 and the fourth magneto-resistive sensor 4 which are enlarged.

As shown in FIG. 2, the plurality of element sections 9 may be arranged at intervals in the Y1-Y2 direction. Each of the element sections 9 may be configured with a non-bias structure (a structure in which a hard bias layer is not provided), and may be formed to be extended in a straight line shape or a strip shape in the X1-X2 direction. The width dimension of each of the element sections 9 (the dimension in the Y1-Y2 direction) may be approximately 0.5 to 5 μm, the height dimension of each of the element sections 9 (the dimension in the X1-X2 direction) may be approximately 2 to 300 μm, and the aspect ratio of each of the element sections 9 (height dimension/width dimension) is approximately 4 to 600.

Each of the element sections 9 may be formed on the insulated foundation layer 19 of the surface of a substrate 15 as shown in FIG. 5 (partial longitudinal section view).

Each of the element sections 9 may be formed in such a way that, for example, from the bottom, a non-magnetic foundation layer 60, a fixed magnetic layer 61, a non-magnetic layer 62, a free magnetic layer 63, and a protection layer 64 may be laminated in order. Each of the layers included in the element section 9 may be formed by, for example, sputtering.

In the embodiment shown in FIG. 5, the fixed magnetic layer 61 may have a laminated ferri structure which may include a first magnetic layer 61*a*, a second magnetic layer 61*b*, and a non-magnetic interlayer 61*c* interposed between the first magnetic layer 61*a* and the second magnetic layer 61*b*. Each of the magnetic layers 61*a* and 61*b* may be formed of a soft magnetic material such as a CoFe alloy (cobalt ferroalloy). The non-magnetic interlayer 61*c* may be formed of Ru. The non-magnetic layer 62 may be formed of a non-magnetic material such as Cu (copper). The free magnetic layer 63 may be formed of a soft magnetic material such as a NiFe alloy (nickel ferroalloy). The protection layer 64 may be formed of Ta (tantalum).

In various embodiments, the fixed magnetic layer 61 may be the laminated ferri structure, that is, a self-pin end shape in which the first magnetic layer 61*a* and the second magnetic layer 61*b* are magnetized and fixed in anti-parallel. In the self-pin end shape shown in FIG. 5, an anti-ferromagnetic layer may not be used. Therefore, each of the magnetic layers 61*a* and 61*c* which are included in the fixed magnetic layer 61 may be magnetized and fixed without performing a heat treatment in the magnetic field. Meanwhile, it is sufficient that the magnetization fixing power of each of the magnetic layers 61*a* and 61*b* may have an amplitude in which magnetization fluctuation does not occur even when an external magnetic field is acting.

However, the laminated structure of the element section 9 shown in FIG. 5 is an example. For example, a configuration which has a laminated structure in which, from the bottom, an anti-ferromagnetic layer, a fixed magnetic layer, a non-magnetic layer, a free magnetic layer, and a protection layer are laminated in order can be provided. In this configuration, the magnetization direction of the fixed magnetic layer can be fixed by generating an exchange-coupled magnetic field (Hex) between the anti-ferromagnetic layer and the fixed magnetic layer. In addition, a laminated structure, in which, from the bottom, the free magnetic layer 63, the non-magnetic material layer 62, the fixed magnetic layer 61, and the protection layer 64 are laminated in order may be provided. In addition, the fixed magnetic layer 61 can be configured such that the first magnetic layer 61*a* and the second magnetic layer 61*b* have the same magnetization amplitude and that the magnetization directions thereof are anti-parallel.

The fixed magnetization direction of the second magnetic layer 61*b* (P; sensitivity axis direction) included in each element section 9 may be the Y2 direction (refer, for example, to FIGS. 2 and 5). The fixed magnetization direction (P) may be the fixed magnetization direction of the fixed magnetic layer 61.

As shown in FIG. 2, the electrode layers 16 may be arranged on the upper surface of each element section 9 at intervals of T1 in the X1-X2 direction.

As shown in FIG. 5, at the location in which each electrode layer 16 is formed, a part of the protection layer 64 may be cut, and the electrode layer 16 may be formed on a depressed section 64*a* which may be formed as a result of cutting.

The electrode layer 16 may be formed of a non-magnetic conductive material which may have lower electrical resistance than those of the element section 9 and the protection layer 64. Although the material of the electrode layer 16 is not particularly limited thereto, the electrode layer 16 may be formed using a single layer formed of a non-magnetic conductive material, such as Al, Cu, Ti or Cr, or the laminated structure thereof. For example, the electrode layer 16 may be formed of a laminated structure including Cu and Al.

As shown in FIG. 2, the width dimension of each electrode layer 16 (dimension of Y1-Y2) may be greater than the width dimension of each element section 9. Therefore, the electrical resistance of the electrode layer 16 can be reduced. In addition, when each of the electrode layers 16 is formed on the upper surface of each element section 9, the margin of the alignment can be widely obtained.

Further, as described above, a part of the protection layer 64 can be cut by performing, for example, etching. The process of cutting a part of the protection layer 64 may be performed to particularly cut an oxidation layer on the surface of the protection layer 64. Therefore, the conductivity between the element section 9 and the electrode layer 16 can be excellent. In addition, when the surface of the protection layer 64 is cut by performing etching, control may be such that a part of the protection layer 64 remains as shown in FIG. 5. Therefore, the free magnetic layer 63 is not affected by the etching and is not removed.

As shown in FIG. 2, the plurality of element sections 9 may be arranged in parallel in the Y1-Y2 direction, and the end portions of each element section 9 in the X1-X2 direction may be electrically connected by the electrode layers (conductive layers) 16, thereby forming a meander shape.

As shown in FIG. 2, each soft magnetic body 12 may be configured to include a first section 12*e* which may be extended in the Y1-Y2 direction, a second section 12*f* which may be extended in the X1 direction from the Y2 side end portion of the first section 12*e* and which may be arranged on the Y2 side of the element section 9 in a plan view, and a third section 12*g* which may be extended in the X2 direction from the Y1 side end portion of the first section 12*e* and which may be arranged on the Y1 side of the element section 9 in a plan view. Each soft magnetic body 12 is formed of NiFe, CoFe, CoFeSiB, or CoZrNb.

The first section 12*e* of each soft magnetic body 12 may be separated from each electrode layer 16 and arranged above the electrode layer 16 while intersecting the electrode layer, as shown in FIG. 2. As shown in FIG. 5, an insulation layer 25 may be interposed between the first section 12*e* and the electrode layer 16, and the first section 12*e* may not electrically come into contact with the electrode layer 16.

Here, in two soft magnetic bodies 12 which may be adjacent in the X1-X2 direction in FIG. 2, a soft magnetic body 12 which is arranged on the X1 side may be defined as a first soft magnetic body 12*a*, and a soft magnetic body 12 which is arranged on the X2 side may be defined as a second soft magnetic body 12*b*. In FIG. 2, numerical symbols 12*a* and 12*b* are attached to only a group of soft magnetic bodies 12. Meanwhile, the soft magnetic body 12 which may be defined as the second soft magnetic body 12*b* in FIG. 2 may become the first soft magnetic body 12*a* because the soft magnetic body 12 is located on the X1 side with respect to a soft magnetic body 12 which is adjacent on the X2 side when viewed from the soft magnetic body 12. That is, with respect to each soft magnetic body, when a pair configured with a soft magnetic body which is adjacent on the left side thereof is considered, the soft magnetic body may correspond to the soft magnetic body 12*b*. When a pair configured with a soft magnetic body which is adjacent on the right side thereof is considered, the soft magnetic body may correspond to the soft magnetic body 12*a*. Therefore, from among the soft magnetic bodies 12 arranged in the X1-X2 direction at intervals, all the soft magnetic bodies 12, excepting a soft magnetic body 12 which is arranged furthest to the X1 side and a soft magnetic body 12 which is arranged furthest to the X2 side, may be either the first soft magnetic body 12*a* or the second soft magnetic body 12*b*.

Further, when the first soft magnetic body 12a and the second soft magnetic body 12b which are identified in FIG. 2 are viewed as representatives, a part of the third section 12g of the first soft magnetic body 12a may face a part of the second section 12f of the second soft magnetic body 12b in the Y1-Y2 direction through a gap G. As shown in FIG. 2, no electrode layer 16 is arranged at a location where the third section 12g of the first soft magnetic body 12a faces the second section 12f of the second soft magnetic body 12b through the gap G. That is, in a plan view, the gap G may be located at the location corresponding to the interval T1 between the electrode layers 16.

As shown in FIG. 2, when an external magnetic field H1 acts toward the X2 direction, the external magnetic field H1 may form a magnetic path M1 of an arrow which passes through the soft magnetic bodies 12 and between the soft magnetic bodies 12 and 12. At this time, as shown in FIG. 6, an external magnetic field H2 may leak to the element section 9 from the third section 12g of the first soft magnetic body 12a to the second section 12f of the second soft magnetic body 12b in the Y2 direction, thus the external magnetic field H2 may act on the element section 9.

As described above, the external magnetic field H1 in the X2 direction may be converted into the external magnetic field in the Y2 direction using the soft magnetic bodies 12, thereby acting on the element section 9.

As described above, the sensitivity axis direction (P) of each element section 9 is the Y2 direction. In addition, the magnetization direction of the free magnetic layer 63 is the X1-X2 direction due to the shape anisotropy of the element section 9. Further, since the external magnetic field H2 acts each element section 9 in the Y2 direction, the magnetization direction of the free magnetic layer 63 may face the Y2 direction. As a result, the magnetization direction of the fixed magnetic layer 61 may be the same as the magnetization direction of the free magnetic layer 63, thus electrical resistance may be reduced.

FIG. 3 is a partially enlarged plan view illustrating the second magneto-resistive sensor 2 and the third magneto-resistive sensor 3 according to an exemplary embodiment.

The difference between the second magneto-resistive sensor 2 and the third magneto-resistive sensor 3 shown in FIG. 3 and the first magneto-resistive sensor 1 and the fourth magneto-resistive sensor 4 shown in FIG. 2 is the configuration of a soft magnetic body 14. That is, the configurations of the element section 9 and the electrode layer 16 are not changed from those shown in FIG. 2.

As shown in FIG. 3, each of the soft magnetic bodies 14 may include a first section 14e which may be extended in the Y1-Y2 direction, a fourth section 14f which may be extended from the Y2 side end portion of the first section 14e to the X2 direction and which may be arranged on the Y2 side of the element section 9 in a plan view, and a fifth section 14g which may be extended from the Y1 side end portion of the first section 14e to the X1 direction and which may be arranged on the Y1 side of the element section 9 in a plan view.

Here, in two soft magnetic bodies 14 which are adjacent in the X1-X2 direction in FIG. 3, a soft magnetic body 14 which is arranged on the X1 side may be defined as a third soft magnetic body 14c, and a soft magnetic body 14 which is arranged on the X2 side may be defined as a fourth soft magnetic body 14d. In FIG. 3, numerical symbols 14c and 14d may be attached to only a group of soft magnetic bodies 14. Meanwhile, the soft magnetic body 14 which is defined as the fourth soft magnetic body 14d in FIG. 3 may become the third soft magnetic body 14c because the soft magnetic body 14 may be located on the X1 side with respect to a soft magnetic body 14 which is adjacent on the X2 side when viewed from the soft magnetic body 14. Therefore, from among the soft magnetic bodies 14 arranged in the X1-X2 direction at intervals, all the soft magnetic bodies 14, excepting a soft magnetic body 14 which is arranged on the most X1 side and a soft magnetic body 14 which is arranged on the most X2 side, may be either the third soft magnetic body 14c or the fourth soft magnetic body 14d.

Further, when the third soft magnetic body 14c and the fourth soft magnetic body 14d which are symbolized in FIG. 3 are viewed as representatives, a part of the fourth section 14f of the third soft magnetic body 14c may face a part of the fifth section 14g of the fourth soft magnetic body 14d in the Y1-Y2 direction through a gap G. As shown in FIG. 3, no electrode layer 16 is arranged at a location where the fourth section 14f of the third soft magnetic body 14c faces the fifth section 14g of the fourth soft magnetic body 14d through the gap G.

As shown in FIG. 3, when an external magnetic field H1 is operated toward the X2 direction, the external magnetic field H1 may form a magnetic path M2 of an arrow which passes through the soft magnetic bodies 14 and between the soft magnetic bodies 14 and 14. At this time, an external magnetic field H3 may leak to the element section 9 from the fourth section 14f of the third soft magnetic body 14c to the fifth section 14g of the fourth soft magnetic body 14d in the Y1 direction, thus the external magnetic field H3 may affect the element section 9.

As described above, in the second magneto-resistive sensor 2 and the third magneto-resistive sensor 3, the external magnetic field H1 in the X2 direction may be converted into the external magnetic field in the Y1 direction using the soft magnetic bodies 14, thereby affecting the element section 9.

As described above, the sensitivity axis direction (P) of each element section 9 is the Y2 direction. In addition, the magnetization direction of the free magnetic layer 63 is the X1-X2 direction due to the shape anisotropy of the element section 9. Further, since the external magnetic field H3 affects each element section 9 in the Y1 direction, the magnetization direction of the free magnetic layer 63 faces the Y1 direction. As a result, the magnetization direction of the fixed magnetic layer 61 may be opposite to the magnetization direction of the free magnetic layer 63, thus electrical resistance is increased.

As described above, when the electrical resistance of the first magneto-resistive sensor 1 and the fourth magneto-resistive sensor 4 is reduced, the electrical resistance of the second magneto-resistive sensor 2 and the third magneto-resistive sensor 3 may be increased, thus it may be possible to obtain different outputs using the bridge circuit shown in FIG. 1.

Figure 7:
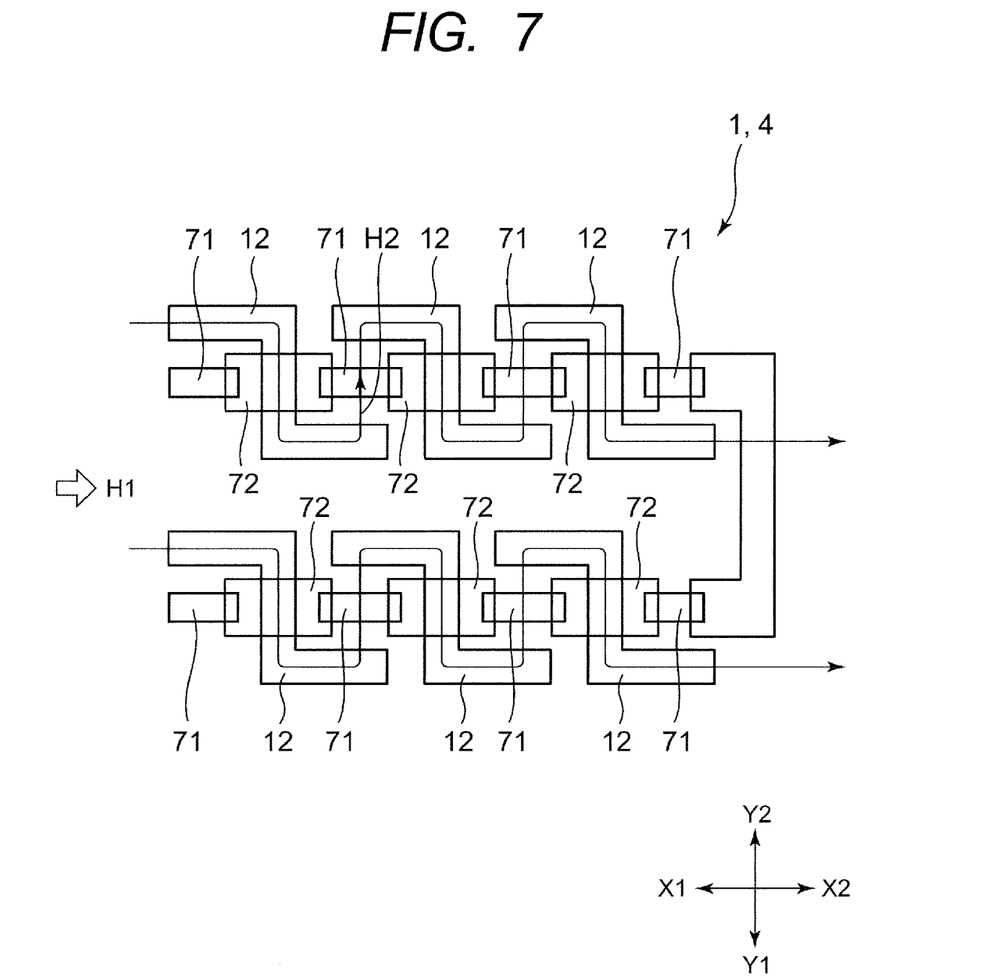
FIG. 7 is a partially enlarged plan view illustrating a magnetic sensor according to a comparative example.

FIG. 7 illustrates the magnetic sensor according to the comparative example. FIG. 7 illustrates a first magneto-resistive sensor and a fourth magneto-resistive sensor. The configuration of an element section 71 shown in FIG. 7 may be the same as that of FIG. 5. In addition, the configuration of a soft magnetic body 12, and the materials of the soft magnetic body 12, the element section 71, and an electrode layer 72 may be the same as in the embodiment. The second magneto-resistive sensor 2 and the third magneto-resistive sensor 3 according to the comparative example may be configured by combining the element section 71 and the electrode layer 72 shown in FIG. 7 with the soft magnetic body 14 shown in FIG. 3.

The difference between the comparative example shown FIG. 7 and the embodiment shown in FIG. 2 is that the element section 9 may be formed in the X1-X2 direction in a long shape in the embodiment shown in FIG. 2 but a plurality of element sections 71 may be separated in the X1-X2 direction at intervals in the comparative example shown in FIG. 7.

Further, in FIG. 7, the electrode layer 72 may electrically connect each of the element sections 71.

As shown in FIG. 7, if it is assumed that the external magnetic field H1 is operated in the X2 direction, the external magnetic field H2 may be operated in the Y2 direction in the element sections 71 which are included in the first magneto-resistive sensor and the fourth magneto-resistive sensor.

However, in FIG. 7, since the longitudinal dimension of each of the element sections 71 in the X1-X2 direction is short, the shape anisotropy effect is low and the magnetization of the free magnetic layer 63 is easily fluctuated in a non-magnetic field state (the non-magnetic field state referred here indicates a state where the external magnetic field H2 does not affect the element sections 71). As a result, there are problems in that the middle point deviation of hysteresis increase and that it is difficult to obtain appropriate linearity. Although it is considered that a hard bias layer is used in order to solve the problems, the hard bias layer causes the magnetization direction to be displaced under a strong magnetic field, thus a problem occurs that outputs are displaced in a resistance-strong magnetic field.

In contrast, in the embodiment, since the element section 9 may be formed in the X1-X2 direction in a long shape, the element section 9 can be arranged other than magnetic field detection, thus it is possible to sufficiently obtain the shape anisotropy effect.

In addition, the present embodiment may include a configuration as described below. That is, as shown in FIG. 2, a joint section 12g1 which does not face the second section 12f of the second soft magnetic body 12b in the third section 12g of the first soft magnetic body 12a and a joint section 12f1 which does not face the third section 12g of the first soft magnetic body 12a in the second section 12f of the second soft magnetic body 12b face the element section 9 in the Y1-Y2 direction, respectively, in a plan view. Further, the electrode layers 16a and 16b (the hatched portions in FIG. 2) may be arranged on the upper surface of the element section 9 which face each of the joint sections 12f1 and 12g1 in a state in which the protection layer 64 is removed (also referee to FIG. 5).

Therefore, in a section which faces the joint sections 12g1 and 12f1 in the Y1-Y2 direction, current flows into the electrode layer 16 prior to the element section 9 (biased), thus it may be possible to cause the element section 9 to have no sensitivity in the section. It may be possible to cause the element section 9 which is not overlapped with the electrode layer 16 to function as an element. Therefore, even when the magnetic field of oblique components (the components which are oblique to both the X1-X2 direction and the Y1-Y2 direction), which may leak toward the element section 9 from the vicinity of the joint sections 12g1 and 12f1, may encroach on the portion of the element section 9 which is in the vicinity of the joint sections 12g1 and 12f1 and which may not have sensitivity, it is difficult to generate a magnetoresistance effect, and the components of the external magnetic field H2, which is parallel to the Y1-Y2 direction, encroach on the portion (the portion which is not overlapped with the electrode layer 16) of the element section 9 which has sensitivity, thus the magnetoresistance effect may be exhibited.

In addition, in the embodiment, a bias layer may not be used unlike the related art, thus the element section 9 has a non-bias structure.

As described above, in the embodiment, the tolerance of the strong magnetic field is excellent compared to the related art, and it may be possible to effectively improve hysteresis and linearity compared to the related example or the comparative example.

FIG. 4 is a partially enlarged plan view illustrating a magnetic sensor according to an exemplary embodiment. In FIG. 4, the electrode layer 16 may not be formed on the upper surface of the element section 9 which face the first section 12e of each of the soft magnetic bodies 12 in the thickness direction (height direction). That is, a structure in which the electrode layers 16a and 16b which are hatched in FIG. 2 may be formed on the upper surface of the element section 9 is provided.

In FIG. 4, even when the magnetic field of oblique components (the components which are oblique to both the X1-X2 direction and the Y1-Y2 direction), which may leak toward the element section 9 from the vicinity of the joint sections 12g1 and 12f1, may encroach on the portion of the element section 9 which may be in the vicinity of the joint sections 12g1 and 12f1 and which does not have sensitivity, it is difficult to generate a magnetoresistance effect, and the components of the external magnetic field H2, which may be parallel to the Y1-Y2 direction, encroach on the portion (the portion which is not overlapped with the electrode layer 16) of the element section 9 which has sensitivity, thus the magnetoresistance effect is exhibited. Further, in FIG. 4, the element section 9 may have the non-bias structure in which the element section 9 may be formed in the X1-X2 direction in a long shape, thus it may be possible to obtain the shape anisotropy effect. Therefore, also in the configuration shown in FIG. 4, the tolerance of the strong magnetic field may be excellent compared to the related art, and it may be possible to effectively improve hysteresis and linearity compared to the related example or the comparative example.

However, if the electrode layer 16 employs the electrode layer 16 shown in FIGS. 2 and 3, which is provided in the portion facing the first section 12e of each of the soft magnetic bodies 12, and which integrates the electrode layers 16a and 16b, the electrode layer 16 can be easily formed. In addition, in FIGS. 2 and 3, the electrode layer 16 may be overlapped with the whole area on the element section 9 for which sensitivity is not necessary, thus it may be possible to more effectively improve hysteresis and linearity.

In the embodiment, if the electrode layer 16 is electrically connected to the element section 9 in an appropriate manner, the protection layer 64 may not necessarily be cut. However, since the oxidation layer is formed on the surface of the protection layer 64, the electrode layer 16 can be electrically connected to the element section 9 in an appropriate manner in such a way that the oxidation layer is cut and the electrode layer 16 may be formed. In addition, the free magnetic layer 63 may not be cut by remaining a part of the protection layer 64 than the free magnetic layer 63 is exposed by cutting all the protection layer 64. Therefore, the shape anisotropy effect may be appropriately exhibited, thus the magnetization direction of the free magnetic layer 63 in the non-magnetic field state may be stabilized in a state in which the magnetization direction appropriately faces the X1-X2 direction, and it may be possible to effectively improve hysteresis and linearity properties.

In various embodiments, the middle point deviation of hysteresis and linearity properties may be obtained when the gap G is changed using the example shown in FIGS. 2 and 3 and the comparative example shown in FIG. 7.

In an experiment, the same-sized external magnetic field facing the X1-X2 direction was applied to each of the magnetic sensor of the example and the magnetic sensor of the comparative example, and hysteresis loops were obtained and middle point deviations were measured at that time. Further, a maximum deviation ratio of an output line to an ideal output line (straight line), obtained when the external magnetic field was operated and the output was gradually raised, was measured. The results of the experiment are shown in Table 1 below.

TABLE 1

|  | Gap (μm) | Middle point deviation |
|---|---|---|
| Example | 1.5 | 1.94 |
|  | 3 | 2.33 |
|  | 4.5 | 2.62 |
| Comparative example | 1.5 | 6.04 |
|  | 3 | 6.65 |
|  | 4.5 | 7.67 |

|  | Gap (μm) | Linearity |
|---|---|---|
| Example | 1.5 | 0.59 |
|  | 3 | 0.80 |
|  | 4.5 | 0.86 |
| Comparative example | 1.5 | 0.81 |
|  | 3 | 1.79 |
|  | 4.5 | 1.36 |

Figure 8A:
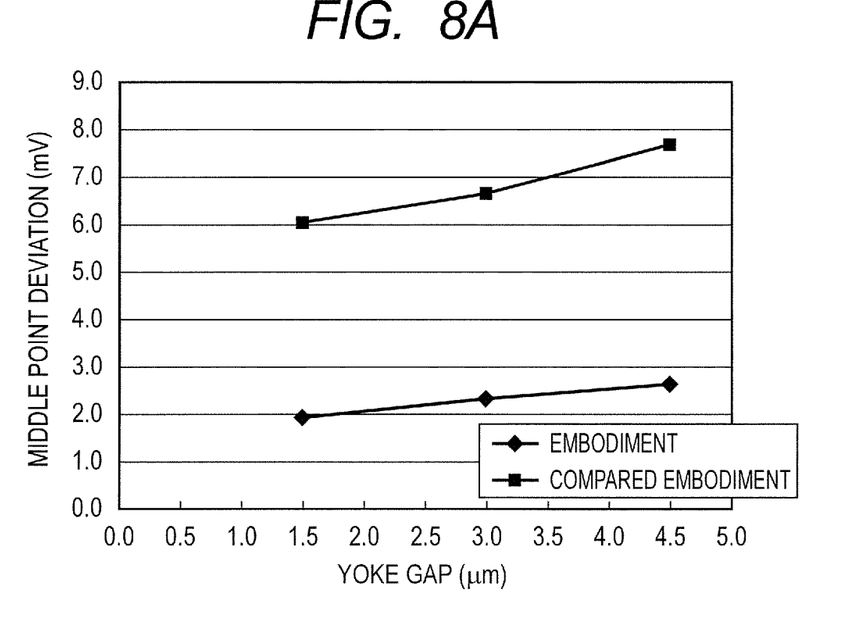
FIG. 8A is a graph illustrating the relationship between a gap and middle point deviation (hysteresis) according to an example and the comparative example.
Figure 8B:
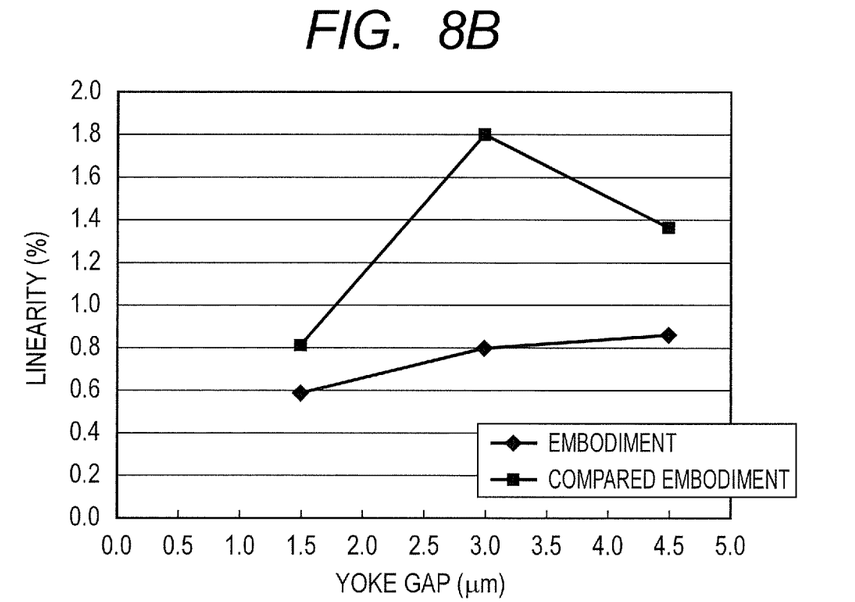
FIG. 8B is a graph illustrating the relationship between a gap and linearity in according to the example and the comparative example.

FIGS. 8A and 8B graphically show Table 1. Either middle point deviation in FIG. 8A or linearity in FIG. 8B may be close to 0 (mv) and 0(%).

As shown in the results of the experiment in FIGS. 8A and 8B, it was understood that, with respect to either the middle point deviation or linearity, it is possible to improve hysteresis and linearity in the example, compared to the comparative example.

It should be understood by those skilled in the art that various modifications, combinations, sub-combinations and alterations may occur depending on design requirements and other factors insofar as they are within the scope of the appended claims of the equivalents thereof.

Accordingly, the embodiments of the present inventions are not to be limited in scope by the specific embodiments described herein. Further, although some of the embodiments of the present disclosure have been described herein in the context of a particular implementation in a particular environment for a particular purpose, those of ordinary skill in the art should recognize that its usefulness is not limited thereto and that the embodiments of the present inventions can be beneficially implemented in any number of environments for any number of purposes. Accordingly, the claims set forth below should be construed in view of the full breadth and spirit of the embodiments of the present inventions as disclosed herein. While the foregoing description includes many details and specificities, it is to be understood that these have been included for purposes of explanation only, and are not to be interpreted as limitations of the invention. Many modifications to the embodiments described above can be made without departing from the spirit and scope of the invention.

What is claimed is:

1. A magnetic sensor comprising:
a non-bias structured element section that has a laminated structure in which, from a bottom, a fixed magnetic layer, a non-magnetic material layer, a free magnetic layer, and a protection layer are laminated in order or in which, from the bottom, the free magnetic layer, the non-magnetic material layer, the fixed magnetic layer, and the protection layer are laminated in order, and that is formed in such a way as to be extended in an X1-X2 direction; and
a plurality of soft magnetic bodies that are arranged on the element section in a contactless manner,
wherein a sensitivity axis direction of the element section is a Y1-Y2 direction which is perpendicular to the X1-X2 direction,
wherein each of the soft magnetic bodies is extended in the Y1-Y2 direction, and includes a first section which faces the element section in a thickness direction in a contactless manner, a second section which is extended from a Y2 side end portion of the first section to the X1 direction and is arranged on the Y2 side of the element section in a plan view, and a third section which is extended from a Y1 side end portion of the first section to the X2 direction and is arranged on the Y1 side of the element section in a plan view,
wherein, in two soft magnetic bodies which are adjacent in the X1-X2 direction, a part of the third section of a first soft magnetic body which is arranged on the X1 side faces a part of the second section of a second soft magnetic body which is arranged on the X2 side via a gap in the Y1-Y2 direction,
wherein a joint section of the third section of the first soft magnetic body, which does not face the second section of the second soft magnetic body, and a joint section of the second section of the second soft magnetic body, which does not face the third section of the first soft magnetic body, respectively face the element section in the Y1-Y2 direction in a plan view, and
wherein, on the element section which faces the joint sections, an electrode layer which biases current is arranged.

2. The magnetic sensor according to claim 1,
wherein the electrode layer is arranged in a state in which a part of the protection layer remains.

3. The magnetic sensor according to claim 1,
wherein the electrode layer is arranged on an upper surface of the element section in the X1-X2 direction at an interval, and the interval is the section where the third section of the first soft magnetic body faces the second section of the second soft magnetic body via the gap, and
wherein the first section of each of the soft magnetic bodies faces the electrode layer in the thickness direction in a contactless state.

4. The magnetic sensor according to claim 1,
wherein a plurality of element sections that are formed to be extended in the X1-X2 direction are provided in the Y1-Y2 direction at intervals, and end portions of the respective element sections in the X1-X2 direction are connected through a conductive layer.

5. The magnetic sensor according to claim 1, further comprising:
a first magneto-resistive sensor, a second magneto-resistive sensor, a third magneto-resistive sensor, a fourth magneto-resistive sensor, each having a non-bias structured element section which has the same laminated structure and sensitivity axis direction,
wherein each of the soft magnetic bodies, arranged in the first magneto-resistive sensor and the fourth magneto-resistive sensor, includes the first soft magnetic body and the second soft magnetic body,
wherein each of the soft magnetic bodies, arranged in the second magneto-resistive sensor and the third magneto-resistive sensor, includes a first section which is extended in the Y1-Y2 direction and faces the element section in the thickness direction in a contactless manner, a fourth section which is extended from the Y2 side portion of the first section to the X2 direction and arranged on the Y2 side of the element section in a plan view, and a fifth section which is extended from the Y1 side end portion of the first section to the X1 direction and arranged on the Y1 side of the element section in a plan view, wherein, in two soft magnetic bodies which are adjacent in the X1-X2 direction, a part of the fourth section of a third soft magnetic body arranged on an X1 side faces a part of the fifth section of a fourth soft magnetic body arranged on the X2 side in the Y1-Y2 direction via the gap, and wherein a bridge circuit is configured in such a way that the first magneto-resistive sensor is connected to the second magneto-resistive sensor in series through a first output unit, the third magneto-resistive sensor is connected to the fourth magneto-resistive sensor in series through a second output unit, the first magneto-resistive sensor is connected to the third magneto-resistive sensor through an input unit, and the second magneto-resistive sensor is connected to the fourth magneto-resistive sensor through a ground.

* * * * *